(12) United States Patent
Choi et al.

(10) Patent No.: US 9,519,167 B2
(45) Date of Patent: Dec. 13, 2016

(54) METHOD OF FORMING PATTERNS AND METHODS OF MANUFACTURING DISPLAY PANELS USING METHODS OF FORMING PATTERNS

(71) Applicant: Samsung Display Co., Ltd., Yongin (KR)

(72) Inventors: Jung-Mi Choi, Seoul (KR); Dae-Hyun Noh, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/745,997

(22) Filed: Jun. 22, 2015

(65) Prior Publication Data
US 2016/0085264 A1    Mar. 24, 2016

(30) Foreign Application Priority Data
Sep. 19, 2014    (KR) .......................... 10-2014-0124898

(51) Int. Cl.
G06F 1/16    (2006.01)
G02F 1/133    (2006.01)

(52) U.S. Cl.
CPC ..................................... *G02F 1/133* (2013.01)

(58) Field of Classification Search
None
See application file for complete search history.

(56) References Cited

U.S. PATENT DOCUMENTS

| | | | |
|---|---|---|---|
| 7,494,766 B2 | 2/2009 | Moon et al. | |
| 2005/0024622 A1* | 2/2005 | Kim | G03F 7/70475 355/75 |
| 2005/0032003 A1* | 2/2005 | Lin | G03F 1/32 430/322 |
| 2007/0275512 A1* | 11/2007 | Jee | H01L 27/1214 438/149 |
| 2013/0032956 A1* | 2/2013 | Kanou | G03F 9/7084 257/797 |

(Continued)

FOREIGN PATENT DOCUMENTS

| | | |
|---|---|---|
| KR | 10-2006-0036606 | 5/2006 |
| KR | 10-2007-0100032 | 10/2007 |
| KR | 10-0962505 | 6/2010 |

*Primary Examiner* — Shamim Ahmed
(74) *Attorney, Agent, or Firm* — H.C. Park & Associates, PLC

(57) ABSTRACT

A method of forming a pattern may include: disposing a first material layer; disposing a first photoresist film including first shot regions; exposing the first shot regions to light, wherein an overlapping region between first shot regions may be overlappingly exposed to light exposures onto the first shot regions; forming a first photoresist pattern by developing the first photoresist film; forming a first pattern by etching the first material layer using the first photoresist pattern as an etching mask; disposing a second material layer on the first pattern; disposing a second photoresist film including second shot regions; exposing the second shot regions, wherein a boundary region between second shot regions may be disposed spaced apart from the overlapping region; forming a second photoresist pattern by developing the second photoresist film; and forming a second pattern by etching the second material layer using the second photoresist pattern as an etching mask.

18 Claims, 9 Drawing Sheets

(56) References Cited

U.S. PATENT DOCUMENTS

2013/0038644 A1     2/2013   Chan et al.
2013/0194205 A1*    8/2013   Park ........................ G06F 3/044
                                                         345/173
2014/0092347 A1*    4/2014   Satoh ................ G02F 1/133514
                                                         349/96

* cited by examiner

METHOD OF FORMING PATTERNS AND METHODS OF MANUFACTURING DISPLAY PANELS USING METHODS OF FORMING PATTERNS

CROSS-REFERENCE TO RELATED APPLICATION

This application claims priority from and the benefit of Korean patent Application No. 10-2014-0124898, filed on Sep. 19, 2014, which is hereby incorporated by reference for all purposes as if fully set forth herein.

BACKGROUND

Field

Exemplary embodiments relate to methods of forming patterns and methods of manufacturing display panels using the same. More particularly, exemplary embodiments of the invention relates to methods of forming patterns utilizing an overlapping partial exposure process, and a method of manufacturing a display panel using the same.

Discussion of the Background

As sizes of display devices increase, a partial exposure process is applied to form a pattern on a substrate by dividing the substrate into several regions. In the partial exposure process, a unit of an exposure process performed using a mask may be referred to as a shot and an exposed portion of a substrate corresponding to one shot may be referred to as a shot region.

However, a distortion of the shot such as a transition, rotation and twisting may occur during the partial exposure process, a boundary region between adjacent shot regions may be misaligned, and a stitch failure may be caused in the boundary region during the partial exposure process. When the stitch failure is generated the boundary region, a visibility of the boundary may be increased and deteriorate a quality of an image displayed on a display device. Further, when substantially the same exposure processes is performed for forming patterns at different levels in manufacturing the display device, a stitch failure generated in the boundary regions may be accumulated at the different levels, such that a larger stitch failure may be finally caused in certain regions of the display device.

The above information disclosed in this Background section is only for enhancement of understanding of the background of the inventive concept, and, therefore, it may contain information that does not form the prior art that is already known in this country to those ordinary skilled in the art.

SUMMARY

Exemplary embodiments provide a method forming a pattern by a selectively overlapping partial exposure process to reduce stitch failure in a boundary region of a pattern.

Exemplary embodiments provide a method of manufacturing a display panel using the method of forming the pattern.

Additional aspects will be set forth in the detailed description which follows, and, in part, will be apparent from the disclosure, or may be learned by practice of the inventive concept.

According to one or more exemplary embodiments, a method of forming a pattern may include: disposing a first material layer on a substrate including an active region; disposing a first photoresist film on the first material layer, the first photoresist film including at least two first shot regions; exposing each of the at least two first shot regions of the first photoresist film to light, wherein an overlapping region at a boundary between adjacent first shot regions may be overlappingly exposed to light exposures onto the adjacent first shot regions; forming a first photoresist pattern on the first material layer by developing the first photoresist film; forming a first pattern on the substrate by etching the first material layer using the first photoresist pattern as an etching mask; disposing a second material layer on the first pattern; disposing a second photoresist film on the second material layer, the second photoresist film including at least two second shot regions; exposing the at least two second shot regions of the second photoresist film to light, wherein a boundary region between adjacent second shot regions may be disposed spaced apart from the overlapping region; forming a second photoresist pattern on the second material layer by developing the second photoresist film; and forming a second pattern on the first pattern by etching the second material layer using the second photoresist pattern as an etching mask.

According to one or more exemplary embodiments, a method of manufacturing a display panel may include: disposing a black matrix formation layer on a substrate including an active region; disposing a first photoresist film on the black matrix formation layer, the first photoresist film including at least two first shot regions; exposing each of the at least two first shot regions of the first photoresist film to light, wherein an overlapping region at a boundary between adjacent first shot regions may be overlappingly exposed to light exposures onto the adjacent first shot regions; forming a first photoresist pattern on the black matrix formation layer by developing the first photoresist film; forming a black matrix pattern on the substrate by etching the black matrix formation layer using the first photoresist pattern as an etching mask; disposing a color filter formation layer on the first pattern; disposing a second photoresist film on the color filter formation layer, the second photoresist film including at least two second shot regions; exposing the at least two second shot regions of the second photoresist film to light, wherein a boundary region between adjacent second shot regions may be disposed spaced apart from the overlapping region; forming a second photoresist pattern on the color filter formation layer by developing the second photoresist film; forming a first to a third color filters on the black matrix pattern by etching the color filter formation layer using the second photoresist pattern as an etching mask; disposing an overcoat formation layer on the second pattern; disposing a third photoresist film on the overcoat formation layer, the third photoresist film including at least two third shot regions; exposing each of the at least two third shot regions of the third photoresist film to light, wherein a boundary region between adjacent third shot regions may be disposed spaced apart from the boundary region between adjacent second shot regions and the overlapping regions; forming a third photoresist pattern on the overcoat formation layer by developing the third photoresist film; and forming an overcoat layer on the second pattern by etching the overcoat formation layer using the third photoresist pattern as an etching mask.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1A:
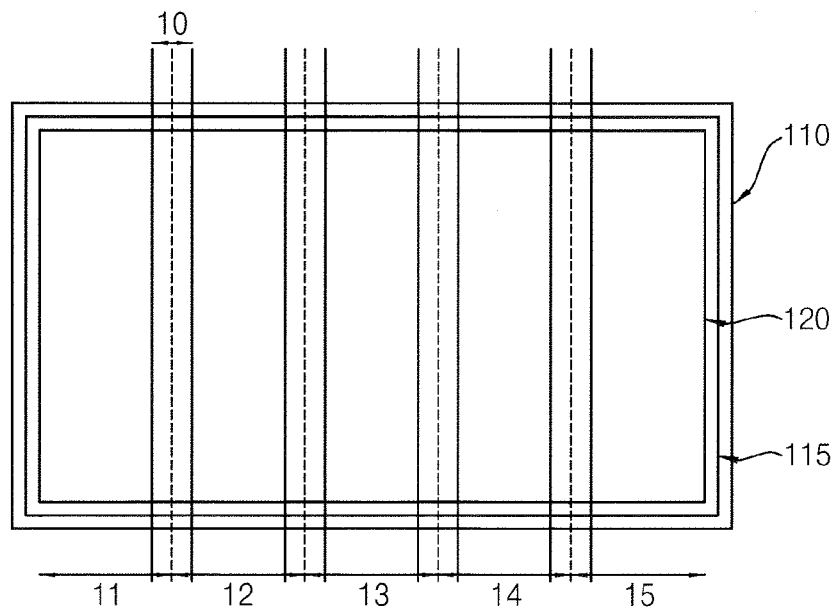
FIGS. 1A, 1B, and 1C are plan views illustrating a method of forming a first pattern, a second pattern, and a third pattern, respectively according to one or more exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. As such, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 1B:
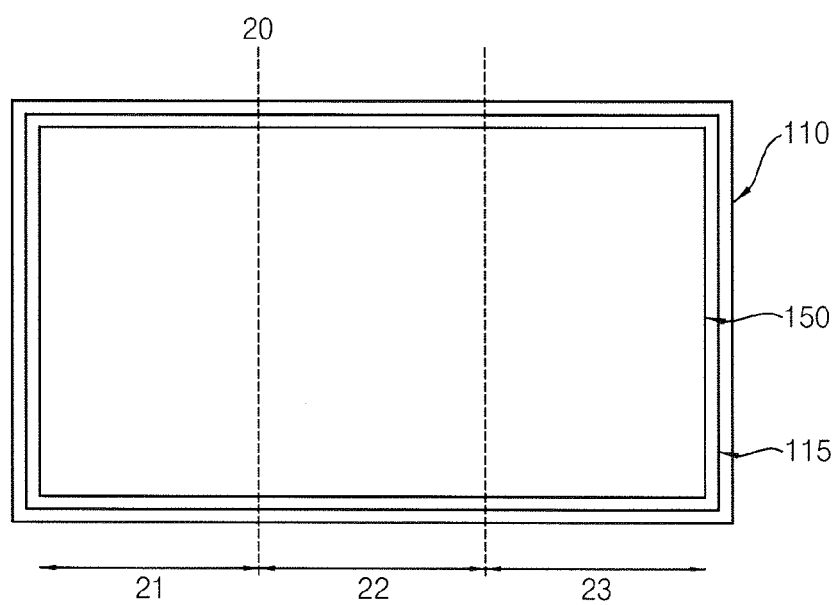
Figure 1C:
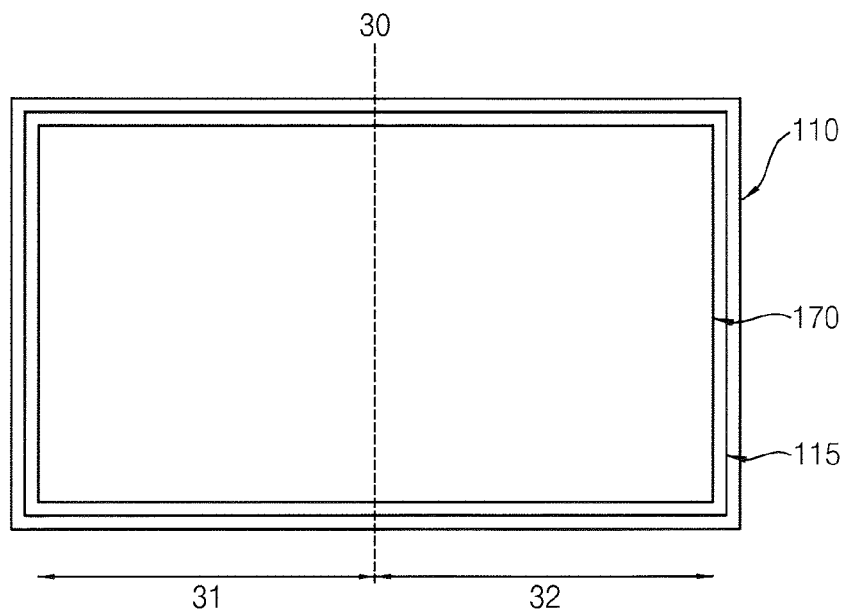

FIGS. 1A, 1B, and 1C are plan views illustrating a method of forming a first pattern, a second pattern, and a third pattern, respectively, according to one or more exemplary embodiments. In a partial exposure process according to exemplary embodiments, an exposure using a mask may be referred to as a "shot" and a portion of a substrate exposed corresponding to a shot may be referred to as a "shot region."

Referring to FIGS. 1A, 1B, and 1C, one active region 115 may be disposed on a substrate 110. According to exemplary embodiments, a first photoresist film, a second photoresist film and a third photoresist film may be partially exposed to a plurality of shots, and form a first photoresist pattern, a second photoresist pattern and a third photoresist pattern, respectively. The first to the third photoresist patterns may be formed from the first to the third photoresist films by an overlapping partial exposure process. According to exemplary embodiments, each of the first to the third photoresist films may include a positive type photoresist film. In this case, unexposed portions of the first to the third photoresist films may be removed during a subsequent development process, the first photoresist pattern, the second photoresist pattern, and the third photoresist pattern may have substantially the same or similar shapes to each other. According to exemplary embodiments, each of the first to the third photoresist films may include a negative type photoresist film, the exposed portions of the first to the third photoresist films may be removed during the development process, and the first photoresist pattern, the second photoresist pattern and the third photoresist pattern may have shapes substantially opposite to the shapes of the first pattern, the second pattern, and the third pattern.

As illustrated in FIG. 1A, the first photoresist film may be divided into five shot regions 11, 12, 13, 14, and 15, and be partially exposed. Here, the first photoresist film may be formed on a first material layer 120 disposed on the substrate 110. For example, the first photoresist film may be formed on the first material layer 120, five partial exposure processes may be repeatedly performed onto the first photoresist film, and the exposed first photoresist film may be developed to form the first photoresist pattern on the first material layer 120. The first material layer 120 may be etched using the first photoresist pattern as an etching mask, and the first pattern may be formed on the substrate 110. For example, the first pattern may include a metal pattern and/or a resin pattern. A process of forming the first pattern will be described in detail.

In exemplary embodiments, an overlapping boundary region 10 may be formed at a boundary between adjacent shot regions 11 and 12. For example, the overlapping boundary region 10 may have a width in a range of about 20,000 μm to about 30,000 μm. The overlapping boundary region 10 between adjacent shot regions 11 and 12 having the above width may have a reduced visibility. However, exemplary embodiments are not limited thereto, and the position of the overlapping boundary region 10 and/or the width of the overlapping boundary region 10 may be varied in accordance with a size of the shot region. The size of the shot region may be determined by a size of the substrate 110. For example, the size of the shot region may decrease as the size of the substrate 110 increases.

The first photoresist film may be exposed five times by a partial exposure process, and then the overlapping boundary region 10 may be repeatedly exposed at the boundary between adjacent shot regions as described above. According to exemplary embodiments, the first photoresist film may be divided into six or seven shot regions in accordance with the size of the substrate 110 and a size of a mask for exposing the first photoresist film, and a superposition exposure may be carried out. According to exemplary embodiments of the method for forming the pattern, the first photoresist film may be divided into the five shot regions 11, 12, 13, 14 and 15, and be partially exposed, overlapping partial exposures of the overlapping boundary region 10 at the boundary between adjacent shot regions, so a pattern margin for the first pattern may be secured or ensured.

Referring to FIG. 1B, the second photoresist film may be divided into three shot regions 21, 22, and 23, and be partially exposed. A boundary region 20 disposed between adjacent shot regions 21 and 22 may be exposed spaced apart from the boundary region between the shot regions for the first pattern (i.e., the overlapping boundary region 10). A second material layer 150 may be formed on the first pattern, and then the second photoresist film may be formed on the second material layer 150. A second photoresist pattern is formed on the second material layer 150 by partially exposing and developing the second photoresist film, and the second material layer 150 may be patterned using the second photoresist pattern as an etching mask. For example, the second pattern may include a metal pattern and/or a resin pattern. Unlike forming the first pattern, the second pattern may be formed by partially exposing the shot regions 21, 22, and 23 of the second photoresist film without overlapping each other.

As illustrated in FIG. 1C, the third photoresist film may be divided into a plurality of shots 31 and 33, and be partially exposed. A boundary region 30 disposed between adjacent shots 31 and 32 may be spaced apart from the boundary between adjacent shot regions for the first pattern (the overlapping boundary region 10) and the boundary region between adjacent shot regions for the second pattern (the boundary region 20). A third material layer 170 may be formed on the second pattern, and then the third photoresist film may be formed on the third material layer 170. A third photoresist pattern may be formed on the second pattern by partially exposing and developing the third photoresist film. The third material layer 170 may be etched using the third photoresist pattern as an etching mask, and the third pattern may be formed on the second pattern. For example, the third pattern may include a metal pattern and/or a resin pattern. Similar to forming the second pattern, the third pattern is formed by partially exposing the shot regions 31 and 32 of the third photoresist film without overlapping each other.

According to exemplary embodiments of the invention, a boundary between adjacent shot regions generated by an overlapping partial exposure process (i.e., the overlapping boundary region 10) may be disposed spaced apart from a boundary between adjacent shot regions generated by a partial exposure process (i.e., the boundary region 20). Hence, a stitch failure caused from distortion of patterns may be reduced or prevented by compensating a difference in patterns of the photoresist film subjected to the overlapping partial exposure process and the photoresist film subjected to the partial exposure process. According to the exemplary embodiments, various patterns may be formed on a relatively large substrate using the above-described exposure process. Further, a display device may produce an improved image quality.

Figure 2:
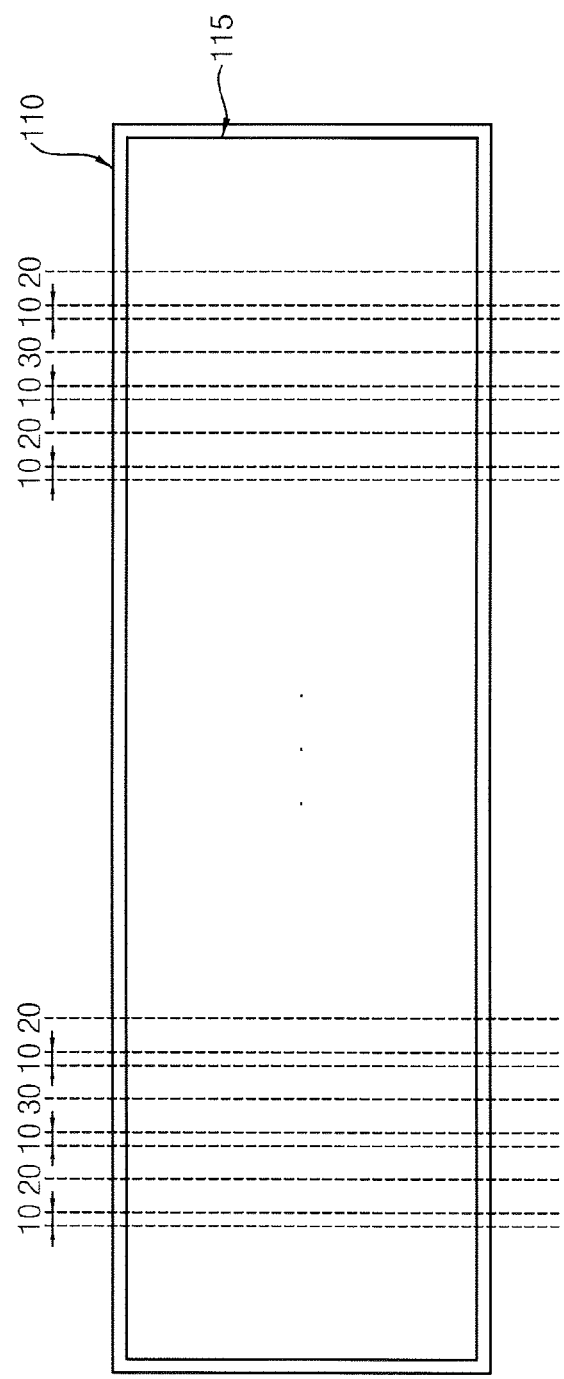
FIG. 2 is a plan view illustrating boundaries in the first pattern, the second pattern, and the third pattern in a method of forming a pattern according to one or more exemplary embodiments.

FIG. 2 is a plan view illustrating boundaries in the first pattern, the second pattern, and the third pattern in a method of forming a pattern according to one or more exemplary embodiments.

Referring to FIG. 2, overlapping boundary region 10 and boundary regions 20 and 30 between adjacent shot regions forming the first pattern, the second pattern, and the third pattern, respectively, may be separated from one another. That is, the overlapping boundary region 10 between adjacent shot regions of the first pattern, the boundary region 20 between adjacent shot regions for the second pattern, and the boundary region 30 between adjacent shot regions for the third pattern may be disposed spaced apart from and without overlapping one another. Thus, the stitch failures, which potentially may occur during the exposure processes for forming the first to the third patterns on the substrate 110, may be uniformly dispersed over an entire face of a substrate 110. For example, a line defect, which may be caused by concentration of the stitch failures at certain portions of a display device, may be reduced or prevented.

According to exemplary embodiments, the number of shots in the exposure process for forming the first pattern may be substantially different from the number of shots in the exposure process for forming the second pattern. The number of shots in the exposure process for forming the third pattern may be substantially different from the number of shots in the exposure process for forming the first pattern and/or the number of shots in the exposure process for forming the second pattern. The number of the masks used in the exposure process for forming the first pattern, the number of the masks used in the exposure process for forming the second pattern, and the number of the masks used in the exposure process for forming the third pattern, may be substantially different from one another. Accordingly, uniformities of the first to the third patterns at different levels over the substrate 100 may be improved by disposing the boundary regions 10, 20 and 30 in a manner spaced apart from one another.

Figure 3A:
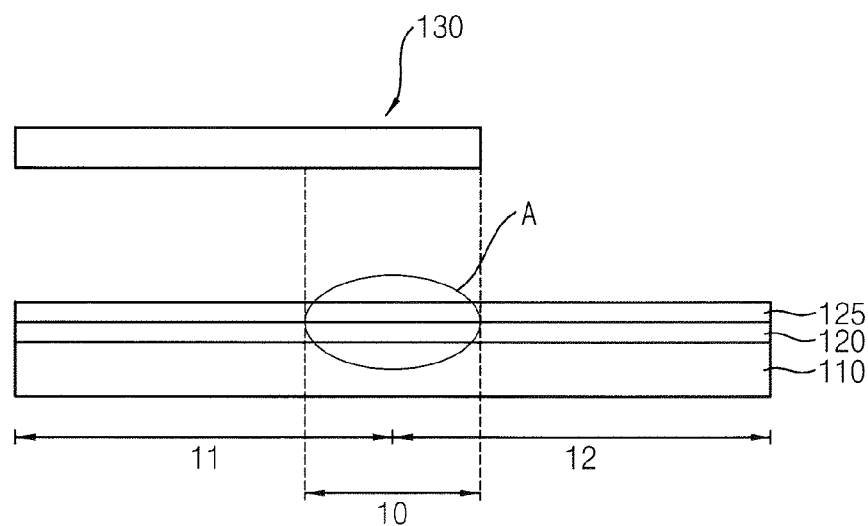
FIGS. 3A and 3B are cross sectional views illustrating a step of forming a first pattern at an overlapping boundary region according to a method of forming a pattern according to one or more exemplary embodiments.
Figure 3B:
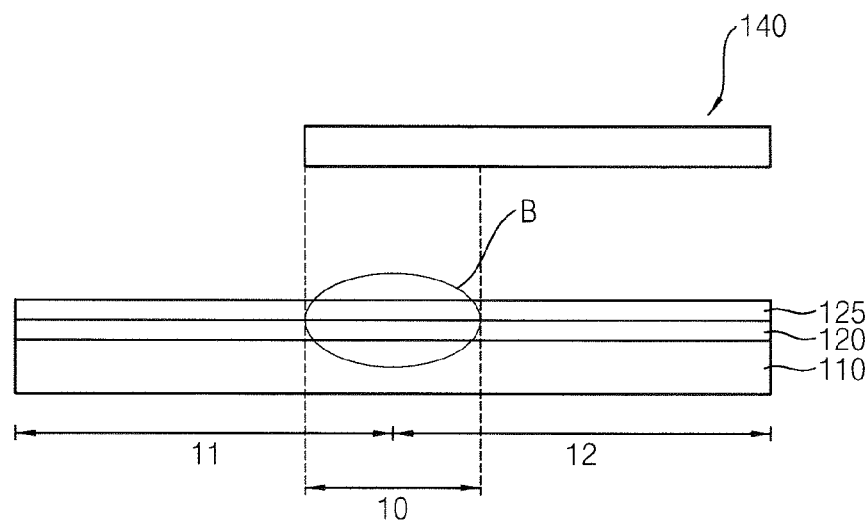
Figure 4:
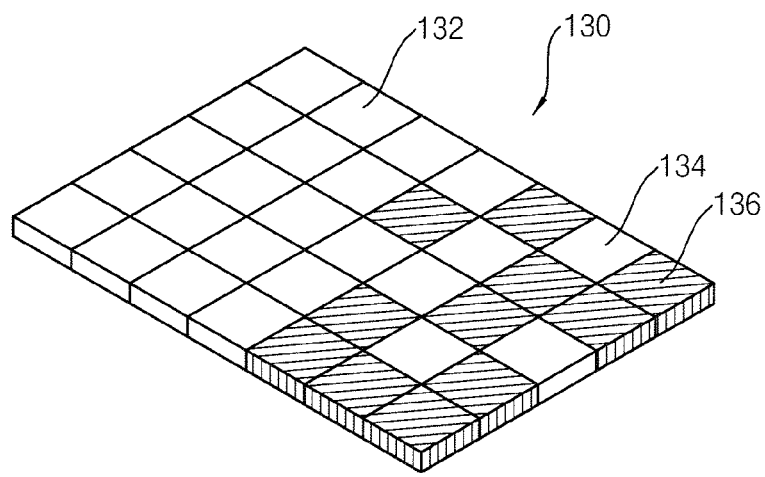
FIG. 4 is a plan view illustrating an exemplary mask used to form a pattern according to exemplary embodiments.
Figure 5:
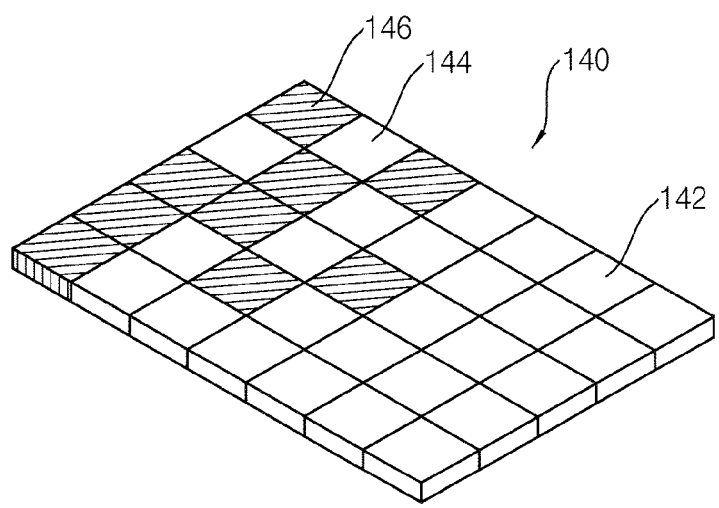
FIG. 5 is a plan view illustrating an exemplary mask used to form a pattern according to exemplary embodiments.
Figure 6:
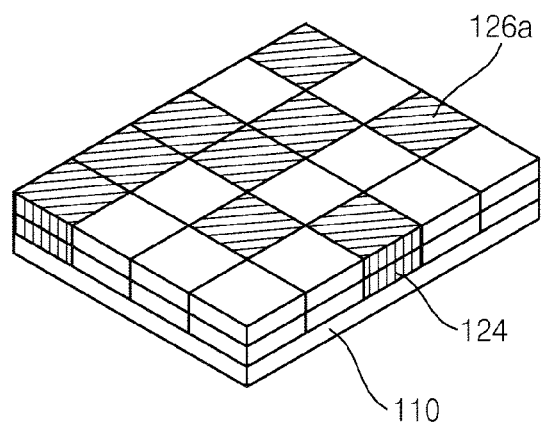
FIG. 6 is an enlarged plan view illustrating an 'A' portion in FIG. 3A.
Figure 7:
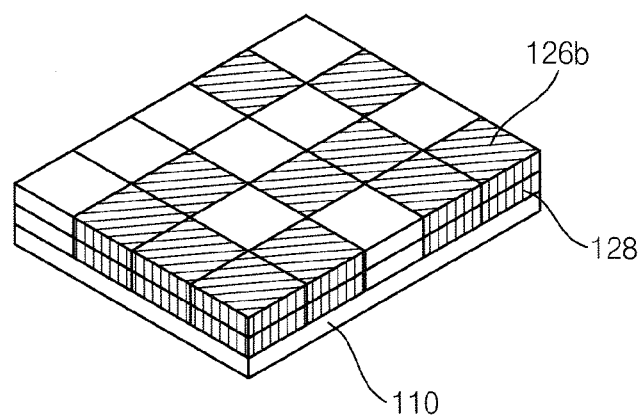
FIG. 7 is an enlarged plan view illustrating a 'B' portion in FIG. 3B.

FIGS. 3A and 3B are cross sectional views illustrating a step of forming a first pattern at an overlapping region, according to an exemplary method of forming a pattern according to one or more exemplary embodiments. FIGS. 4 and 5 are plan views illustrating exemplary masks used to form the patterns, according to exemplary embodiments. FIG. 6 is an enlarged plan view illustrating an 'A' portion in FIG. 3A, and FIG. 7 is an enlarged plan view illustrating a 'B' portion in FIG. 3B, according to one or more exemplary embodiments.

Referring to FIGS. 3A, 3B, 4, 5, 6, and 7, a first mask 130 and a second mask 140 may be used in exposure process for a first photoresist film 125 formed on a first material layer 120 disposed on a substrate 110. For example, the first mask 130 may be used in a first shot performed onto the first photoresist film 125, and the second mask 140 may be used in a second shot performed on the first photoresist film 125.

According to exemplary embodiments, a first main pattern (not illustrated) and a first sub-pattern 124 may be formed in a first shot region 11 and an overlapping region 10 using a first photoresist pattern 126a obtained by the first shot as an etching mask, and a second main pattern (not illustrated) and a second sub-pattern 128 may be formed in a second shot region 12 and the overlapping region 10 using a second photoresist pattern 126b obtained by the second shot as an etching mask. The first mask 130 and the second mask 140 may provide mutually complimentary pattern in the overlapping boundary region 10. In other words, the pattern positioned in the overlapping boundary region 10 may be obtained by combining a pattern formed by a first sub-transmissive pattern 134 of the first mask (e.g., the first sub-pattern 124) with a pattern formed by a second-transmissive pattern 144 of the second mask (e.g., the second sub-pattern 128). A portion of the first material layer 120 located in the first shot region 11 and the overlapping boundary region 10 may be primarily etched using the first photoresist pattern 126a obtained by the first shot, an then may be secondarily etched using the second photoresist pattern 126b obtained by the second shot. This process may be repeated for other portions of the first material layer 120 and form a first pattern on the substrate 110.

As described above, the first shot may be executed on the first photoresist film 125 using the first mask 130, and the second shot may be performed onto the first photoresist film 125 using the second mask 140. According to exemplary embodiments, the first shot and the second shot may be simultaneously carried out. According to the exemplary embodiments, in the overlapping boundary region 10, the number of the first sub-patterns 124 formed by the first sub-transmissive pattern 134 of the first mask 130 may be gradually reduced in a direction from the first shot region toward the second shot region, and the number of the second sub-patterns 128 formed by the second sub-transmissive pattern 144 of the second mask 140 may be gradually increased in a direction from the second shot region toward the second region. When the first pattern is formed by the above-described process, the first sub-pattern 124 formed by the first mask 130 may be combined with the second sub-pattern 128 formed by the second mask 140 in the overlapping boundary region 10, and generation of the stitch in the overlapping boundary region 10 may be reduced, minimized, or prevented. As a result, stain at a boundary between adjacent shot regions may be substantially reduced, prevented, or removed.

Referring to FIG. 4, the first mask 130 may have a first main-transmissive pattern 132, the first sub-transmissive pattern 134, and a first light blocking pattern 136. The first sub-transmissive pattern 134 may be disposed at a peripheral portion of the first mask 130. The first sub-pattern 124 formed by the first sub-transmissive pattern 134 and the second sub-pattern 128 formed by the second sub-transmissive pattern 144 may be mutually complimentary and the combination of the first sub-pattern 124 and the second sub-pattern 128 may form the first pattern in the overlapping boundary region 10.

Referring to FIG. 5, the second mask 140 may have a second main-transmissive pattern 142, the second sub-transmissive pattern 144 and a second light blocking pattern 146. The second sub-transmissive pattern 144 may be disposed at a peripheral portion of the second mask 140. As described above, the first sub-pattern 124 obtained by the first sub-transmissive pattern 134 and the second sub-pattern 128 obtained by the second sub-transmissive pattern 144 may be disposed in the overlapping boundary region 10 mutually complimentary, and the combination of the first sub-pattern 124 and the second sub-pattern 128 may form the first pattern in the overlapping boundary region 10.

According to exemplary embodiments, the first pattern may be formed on the substrate 110 by repeatedly performing exposure processes using one mask. The mask may have two substantially opposing sub-transmissive patterns which may have mutually complimentary structures, respectively. In other words, when the mask has a main-transmissive pattern in the center and four sub-transmissive patterns disposed on left, right, top and bottom of the main-transmissive pattern, and an upper sub-transmissive pattern and a lower sub-transmissive pattern may have mutually complimentary structures to each other, and a right sub-transmissive pattern and a left sub-transmissive pattern may have mutually complimentary structures to other. Thus, in case that the exposure process is performed onto the first photoresist film 125 while moving the mask from a first direction to a second direction substantially perpendicular to the first direction, or from the second direction to the first direction, the main pattern formation regions of the first photoresist film 125 may be formed by one exposure through the main-transmissive pattern, and sub-pattern formation regions of the first photoresist film 125 may be formed by two exposures through the upper and lower sub-patterns or right and left sub-patterns. As a result, a photoresist pattern for forming the first pattern may be provided on the first material layer 120.

Although the first photoresist film 125 may be exposed by the overlapping partial exposure process using the first and the second masks 130 and 140, the present invention is not limited thereto. The overlapping partial exposure process may be carried out using more masks in accordance with various factors including a size of the substrate 110, sizes of the first and the second masks 130 and 140, etc. According to exemplary embodiments, the overlapping partial exposure process may be repeatedly executed on the first photoresist film 125 using one mask. According to exemplary embodiments, the overlapping partial exposure process may be performed onto the first photoresist film 125 using more than three masks in accordance with a size of the substrate 110.

Figure 8A:
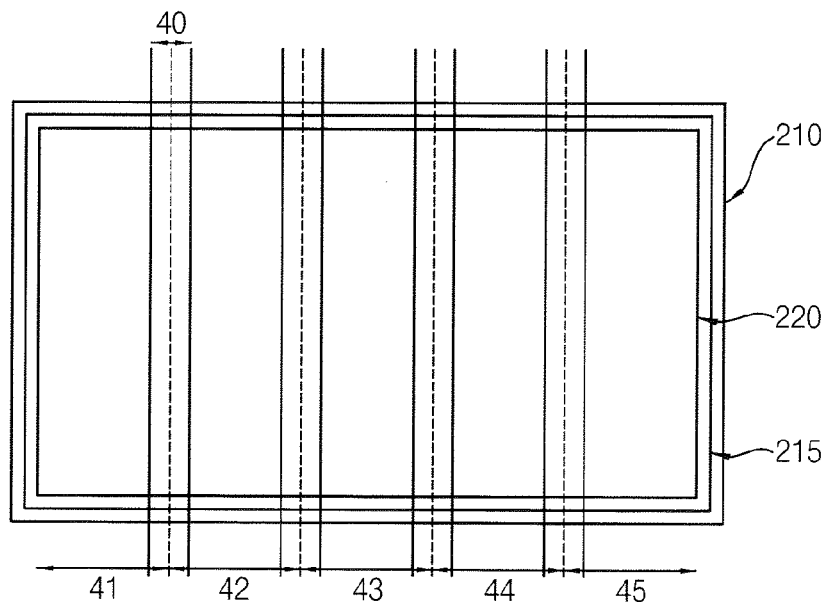
FIGS. 8A, 8B, and 8C are plan views illustrating a method of forming a pattern according to one or more exemplary embodiments.
Figure 8B:
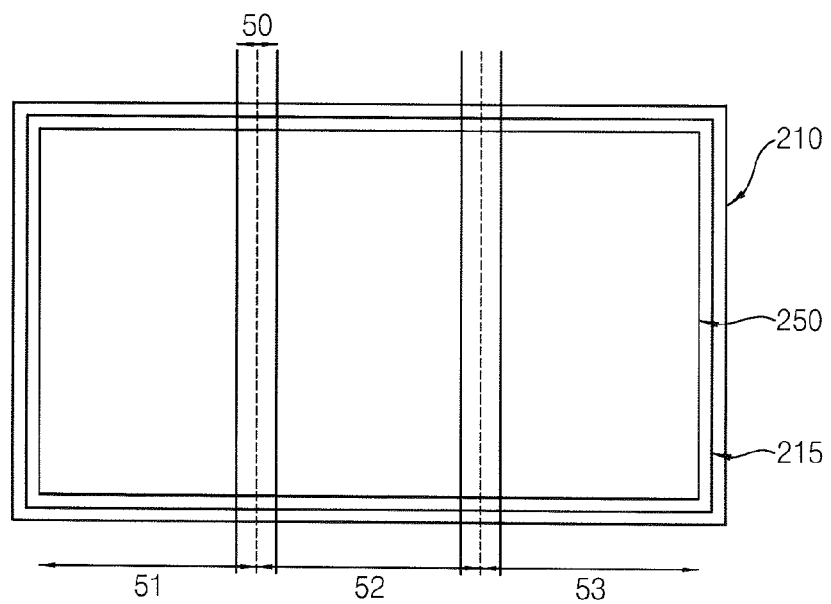
Figure 8C:
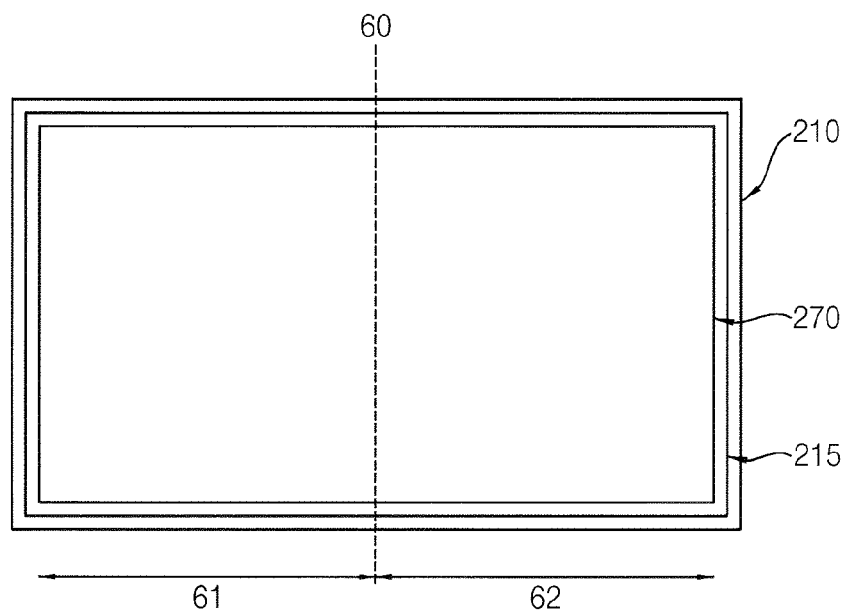

FIGS. 8A, 8B, and 8C are plan views illustrating a method of forming a pattern, according to one or more exemplary embodiments.

Referring to FIG. 8A, after forming a first photoresist film on a first material layer 220 disposed on a substrate 210, the first photoresist film may be divided into a plurality of shot regions 41, 42, 43, 44, and 45. A partial exposure process may be executed on the first photoresist film, and an overlapping boundary region 40 between adjacent shot regions 41 and 42 may be exposed overlapped during exposing the first photoresist film. With reference to the overlapping boundary region 40, a sub-pattern disposed in a left shot region 41 may be substantially complimentary to a pattern formed in a right shot region 42. Then, the first photoresist film may be developed to form a first photoresist pattern on the first material layer 220. The first material layer 220 may be patterned using the first photoresist pattern as an etching mask and form a first pattern on the substrate 210.

Referring to FIG. 8B, a second material layer 250 may be formed on the first pattern, and then a second photoresist film may be formed on the second material layer 250. The second photoresist film may be divided into a plurality of shot regions 51, 52, and 53. The second photoresist film may be subjected to an overlapping partial exposure process. An overlapping region 50 may be generated at a boundary between adjacent short regions 51 and 52, and the overlapping region 50 may be disposed spaced apart from and without overlapping the boundary region 40. The second photoresist film may be developed to form a second photoresist pattern on the second material layer 250. The second material layer 250 may be etched using the second photoresist pattern as an etching mask. So that a second pattern may be formed on the first pattern or on the substrate 210 between adjacent first patterns. For example, the second pattern may have substantial stripe shape. With reference to the overlapping region 50, adjacent second patterns may have structures substantially symmetrical to one another.

Referring to FIG. 8C, a third material layer 270 may be formed on the second pattern. A third photoresist film may be formed on the third material layer 270, and the third photoresist film may be divided into a plurality of shot regions 61 and 62. The third photoresist film may also be subjected a partial exposure process or an overlapping partial exposure process. For example, an overlapping region 60 at a boundary between adjacent shot regions may be spaced apart from the overlapping boundary region 40 and the overlapping region 50. A third photoresist pattern may be formed on the third material layer 270 by developing the third photoresist film. The third material layer may be etched using the third photoresist pattern as an etching mask to form a third pattern on the second pattern.

Figure 9A:
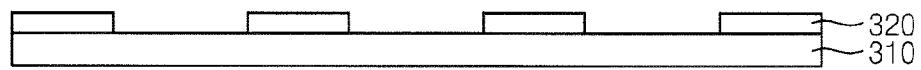
FIGS. 9A, 9B, and 9C are cross-sectional views illustrating a method of manufacturing a display panel in accordance with exemplary embodiments.
Figure 9B:
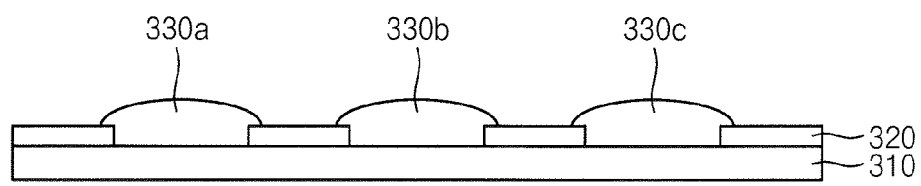
Figure 9C:
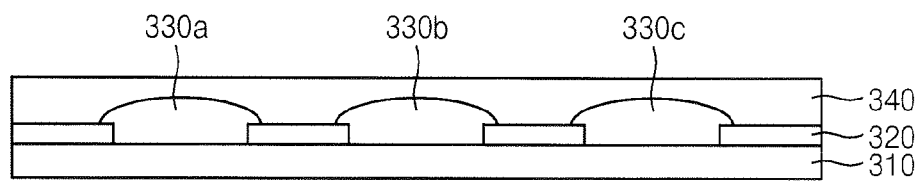

FIGS. 9A, 9B, and 9C are cross sectional views illustrating a method of manufacturing a display panel in accordance with exemplary embodiments.

Referring to FIG. 9A, a black matrix pattern formation layer (not illustrated) may be formed on a substrate 310. The black matrix pattern formation layer may be formed using at least one of black silicon, carbon black, etc. A first photoresist film (not illustrated) may be formed on the black matrix pattern formation layer, and then a first mask (not illustrated) and a second mask (not illustrated) may be disposed over the first photoresist film. Then, the first photoresist film may be exposed by dividing the first photoresist film into a plurality of shot regions. Here, overlapping regions of the first photoresist film at a boundary between adjacent shot regions may be continuously exposed by an overlapping partial exposure process. The exposed first photoresist film may be subjected to a developing process, and a first photoresist pattern (not illustrated) may be formed on the black matrix pattern formation layer. Using the first photoresist film as an etching mask, the black matrix pattern formation layer may be etched to form a black matrix pattern 320 on the substrate 310. For example, the black matrix pattern 320 may serve a light blocking layer in a display device. According to exemplary embodiments, a first shot may be performed onto the black matrix pattern formation layer using the first mask, and then a second shot may be executed on the black matrix pattern formation layer using the second mask. Here, the number of first sub-black matrix patterns formed using the first mask may be decreased in a direction from the first shot region toward the second shot region, and the number of second sub-black matrix patterns formed using the second mask may be increased along the direction from the first shot region toward the second shot region. Thus, the first sub-black matrix patterns may be combined with the second sub-black matrix patterns in the overlapping regions.

In exemplary embodiments, the black matrix pattern 320 may have a substantial stripe shape. In this case, the black matrix pattern 320 may be continuously formed at the boundary regions (i.e., the overlapping regions) between adjacent shot regions, however, the first and the second sub-black matrix patterns of the black matrix pattern 320 may be combined in the boundary regions, and thus, the boundary regions between adjacent shot regions may have substantially reduced visibility.

Referring to FIG. 9B, a color filter formation layer (not illustrated) may be formed on the substrate 310 having the black matrix pattern 320 thereon, and then a second photoresist film (not illustrated) may be formed on the color filter formation layer. A third mask (not illustrated) may be disposed over the second photoresist film, and the second photoresist film may be divided into a plurality of shot regions and exposed. Here, a boundary region between adjacent regions may be disposed spaced apart from the boundary region of the first photoresist pattern. The second photoresist film may be developed to form a second photoresist pattern on the color filter formation layer. The color filter formation layer may be etched using the second photoresist pattern as an etching mask, to form a first color filter 330a, a second color filter 330b and a third color filter 330c disposed on the substrate 320 between the black matrix patterns 320, respectively. For example, each of the first to the third color filters 330a, 330b and 330c may have a substantial island shape. The first to the third color filters 330a, 330b and 330c may not be formed in the boundary regions, such that the boundary region between adjacent shot regions may not be substantially recognized. According to exemplary embodiments, in case the first to the third color filters 330*a*, 330*b* and 330*c* has a substantial stripe shape, the first to the third color filters 330*a*, 330*b* and 330*c* may be disposed in the boundary regions, and thus, the overlapping partial exposure process may reduce the visibility at the boundary region.

Referring to FIG. 9C, an overcoat formation layer (not illustrated) may be formed on the black matrix pattern 320 and the first to the third color filters 330*a*, 330*b* and 330*c*. A third photoresist film (not illustrated) may be formed on the overcoat formation layer. A fourth mask (not illustrated) may be disposed over the third photoresist film, and the third photoresist film may be divided into a plurality of shot regions and exposed. Here, boundary regions between adjacent shot regions may be disposed spaced apart from the boundary regions of the second photoresist pattern and the boundary regions of the first photoresist pattern. A third photoresist may be formed on the overcoat formation layer by developing the third photoresist film. The overcoat formation layer may be etched using the third photoresist pattern as an etching mask, such that an overcoat layer 340 may be formed on the black matrix pattern 320 and the first to the third color filters 330*a*, 330*b*, and 330*c*. Although the overcoat layer 340 may be formed in the boundary region, the visibility at the boundary region may be reduced by performing an overlapping partial exposure process onto the overcoat formation layer instead of a partial exposure process.

Although it is not illustrated, the display panel may include an additional substrate facing the substrate 310, a display structure disposed between the substrate 310 and the additional substrate, etc.

According to one or more exemplary embodiments, a polarization member (not illustrated) may be formed beneath a bottom face of the substrate 310 when the display panel is used in a transparent display device. The polarization member may substantially block a light incident into the substrate 310. For example, the polarization member may have a transmittance of about 40% to about 60%, so that the polarization member may reduce the visibility caused by stitch failures generated in the formation of various patterns on the substrate 310.

The display panel according to exemplary embodiments may be applied to various display apparatuses for automobiles, vessels, aircrafts, medical machines, telecommunication equipments, etc, and the display apparatuses may have improved quality of images displayed.

According to exemplary embodiments, the boundary between adjacent shot regions generated in an overlapping partial exposure process may be disposed spaced apart from a boundary between adjacent shot regions generated by a partial exposure process. Hence, a stitch failure caused from distortion of patterns may be reduced or prevented by compensating a difference between a photoresist film subjected to the overlapping partial exposure process and a photoresist film subjected to the partial exposure process. In the exposure process according to exemplary embodiments, various patterns may be formed on a substrate. A display device including the display panel according to the exemplary embodiments may have an improved quality of an image.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A method of forming a pattern, comprising:
   disposing a first material layer on a substrate comprising an active region;
   disposing a first photoresist film on the first material layer, the first photoresist film comprising at least two first shot regions;
   exposing each of the at least two first shot regions of the first photoresist film to light, wherein an overlapping region at a boundary between adjacent first shot regions is overlappingly exposed to light exposures onto the adjacent first shot regions;
   forming a first photoresist pattern on the first material layer by developing the first photoresist film;
   forming a first pattern on the substrate by etching the first material layer using the first photoresist pattern as an etching mask;
   disposing a second material layer on the first pattern;
   disposing a second photoresist film on the second material layer, the second photoresist film comprising at least two second shot regions;
   exposing the at least two second shot regions of the second photoresist film to light, wherein a boundary region between adjacent second shot regions is disposed spaced apart from the overlapping region;
   forming a second photoresist pattern on the second material layer by developing the second photoresist film; and
   forming a second pattern on the first pattern by etching the second material layer using the second photoresist pattern as an etching mask,
   wherein forming the first photoresist pattern comprises:
      exposing a first shot onto the first photoresist film using a first mask comprising a first main-transmissive pattern, a first sub-transmissive pattern, and a first light blocking pattern; and
      exposing a second shot onto the first photoresist film using a second mask comprising a second main-transmissive pattern, a second sub-transmissive pattern, and a second light blocking pattern.

2. The method of claim 1, further comprising:
   disposing a third material layer on the second pattern;
   disposing a third photoresist film on the third material layer, the third photoresist film comprising at least two third shot regions;
   exposing each of the at least two third shot regions of the third photoresist film to light, wherein a boundary region between adjacent third shot regions is spaced apart from the boundary region between adjacent second shot regions and the overlapping region;
   forming a third photoresist pattern on the third material layer by developing the third photoresist film; and
   forming a third pattern on the second pattern by etching the second material layer using the third photoresist pattern as an etching mask.

3. The method of claim 2, wherein the first pattern comprises:
   a first main pattern formed by the first main-transmissive pattern of the first mask;
   a first sub-pattern formed by the first sub-transmissive pattern of the first mask;
   a second main pattern formed by the second main-transmissive pattern of the second mask; and a second sub-pattern formed by the second sub-transmissive pattern of the second mask, and
wherein the first sub-pattern and the second sub-pattern are mutually complimentary, and the first pattern disposed in the overlapping region is formed by a combination of the first sub-pattern and the second sub-pattern.

4. The method of claim 2, wherein the number of the first sub-patterns gradually decreases in the overlapping region along a direction from the first shot region toward the second shot region.

5. The method of claim 4, wherein the number of the second sub-patterns gradually increases in the overlapping region along a direction from the first shot region toward the second shot region.

6. The method of claim 2, wherein the first shot and the second shot are exposed substantially simultaneously onto the first photoresist film.

7. The method of claim 2, wherein the number of the shots partially exposing the first photoresist film to light, the number of the shots partially exposing the second photoresist film to light, and the number of the shots partially exposing the third photoresist film to light are different from one another.

8. The method of claim 2, wherein the number of the masks used in exposing the first photoresist film to light, the number of the masks used in exposing the second photoresist film to light, and the number of the masks used in exposing the third photoresist film to light are different from one another.

9. The method of claim 2, wherein each of the first mask and the second mask have a size smaller than the active region.

10. The method of claim 2, wherein each of the first pattern and the third pattern has a stripe shape, and the second pattern has an island shape.

11. The method of claim 2, wherein each of the first pattern, the second pattern, and the third pattern is selected from a group consisting of a metal pattern and a resin pattern.

12. The method of claim 2, wherein the boundary region between adjacent second shot regions is overlappingly exposed to light exposures onto the adjacent second shot regions of the second photoresist film.

13. The method of claim 12, wherein the second pattern has a stripe shape.

14. The method of claim 2, wherein the boundary region between adjacent third shot regions is overlappingly exposed to light exposures onto the adjacent third shot regions of the third photoresist film.

15. A method of manufacturing a display panel, comprising:
disposing a black matrix formation layer on a substrate comprising an active region;
disposing a first photoresist film on the black matrix formation layer, the first photoresist film comprising at least two first shot regions;
exposing each of the at least two first shot regions of the first photoresist film to light, wherein an overlapping region at a boundary between adjacent first shot regions is overlappingly exposed to light exposures onto the adjacent first shot regions;
forming a first photoresist pattern on the black matrix formation layer by developing the first photoresist film;
forming a black matrix pattern on the substrate by etching the black matrix formation layer using the first photoresist pattern as an etching mask;
disposing a color filter formation layer on the first pattern;
disposing a second photoresist film on the color filter formation layer, the second photoresist film comprising at least two second shot regions;
exposing the at least two second shot regions of the second photoresist film to light, wherein a boundary region between adjacent second shot regions is disposed spaced apart from the overlapping region;
forming a second photoresist pattern on the color filter formation layer by developing the second photoresist film;
forming a first to a third color filters on the black matrix pattern by etching the color filter formation layer using the second photoresist pattern as an etching mask;
disposing an overcoat formation layer on the second pattern;
disposing a third photoresist film on the overcoat formation layer, the third photoresist film comprising at least two third shot regions;
exposing each of the at least two third shot regions of the third photoresist film to light, wherein a boundary region between adjacent third shot regions is disposed spaced apart from the boundary region between adjacent second shot regions and the overlapping regions;
forming a third photoresist pattern on the overcoat formation layer by developing the third photoresist film; and
forming an overcoat layer on the second pattern by etching the overcoat formation layer using the third photoresist pattern as an etching mask,
wherein exposing the first photoresist film comprises:
exposing a first shot onto the first photoresist film using a first mask comprising a first main-transmissive pattern, a first sub-transmissive pattern and a first light blocking pattern; and
exposing a second shot onto the first photoresist film using a second mask comprising a second main-transmissive pattern, a second sub-transmissive pattern and a second light blocking pattern.

16. The method of claim 15, wherein the black matrix pattern comprises:
a first main black matrix pattern formed by the first main-transmissive pattern of the first mask;
a first sub-black matrix pattern formed by the first sub-transmissive pattern of the first mask;
a second main black matrix pattern formed by the second main-transmissive pattern of the second mask; and
a second sub-black matrix pattern formed by the second sub-transmissive pattern of the second mask, and
wherein the first sub-black matrix pattern and the second sub-black matrix pattern is mutually complimentary, and the black matrix pattern disposed in the overlapping region is formed by a combination of the first sub-pattern and the second sub-pattern.

17. The method of claim 16, wherein the number of the first sub-black matrix patterns gradually decreases in the overlapping region along a direction from the first shot region toward the second shot region, and the number of the second sub-black matrix patterns gradually increases in the overlapping region along the direction from the first shot region toward the second shot region.

18. The method of claim 15, further comprising:
forming a polarization member beneath a bottom face of the substrate.

* * * * *